(12) United States Patent
Manepalli et al.

(10) Patent No.: US 8,093,105 B2
(45) Date of Patent: Jan. 10, 2012

(54) METHOD OF FABRICATING A CAPILLARY-FLOW UNDERFILL COMPOSITIONS

(75) Inventors: Rahul N. Manepalli, Chandler, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/113,960

(22) Filed: May 23, 2011

(65) Prior Publication Data

US 2011/0223722 A1    Sep. 15, 2011

Related U.S. Application Data

(62) Division of application No. 11/613,805, filed on Dec. 20, 2006, now Pat. No. 7,948,090.

(51) Int. Cl.
*H01L 21/00* (2006.01)
*H01L 23/48* (2006.01)
*B32B 27/38* (2006.01)
*C08L 61/00* (2006.01)

(52) U.S. Cl. ........ 438/118; 257/783; 428/414; 525/481; 525/487; 525/523

(58) Field of Classification Search .......... None
See application file for complete search history.

(56) References Cited

U.S. PATENT DOCUMENTS

| | | | |
|---|---|---|---|
| 6,379,997 B1 | 4/2002 | Kawahara et al. | |
| 6,458,472 B1 | 10/2002 | Konarski et al. | |
| 6,620,512 B2 | 9/2003 | Jayaraman et al. | |
| 6,882,058 B2 | 4/2005 | Chan et al. | |
| 7,041,736 B2 | 5/2006 | Jayaraman et al. | |
| 7,084,492 B2 | 8/2006 | Jayaraman | |
| 7,202,304 B2 | 4/2007 | Jayaraman et al. | |
| 7,247,683 B2 | 7/2007 | Hurley et al. | |
| 7,294,915 B2 | 11/2007 | Jayaraman | |
| 7,351,784 B2 | 4/2008 | Lehman, Jr. | |
| 7,948,090 B2 * | 5/2011 | Manepalli et al. | ............. 257/783 |
| 2002/0014703 A1 | 2/2002 | Capote et al. | |
| 2003/0124378 A1 | 7/2003 | Konarski et al. | |
| 2004/0178502 A1 | 9/2004 | Ishikawa et al. | |
| 2005/0263888 A1 | 12/2005 | Jiang et al. | |
| 2006/0073344 A1 | 4/2006 | Jayaraman | |
| 2007/0284758 A1 | 12/2007 | Zhang et al. | |

(Continued)

FOREIGN PATENT DOCUMENTS

WO    03/044089 A1    5/2003

OTHER PUBLICATIONS

Berndlmaier, R. et al.,"Evaluation of Additives for High Solids, Low VOC Polyester-Melamine Coatings", Journal of Coatings Technology, vol. 62, Issue 790,1990, pp. 37-45.

(Continued)

*Primary Examiner* — Alonzo Chambliss
(74) *Attorney, Agent, or Firm* — John N. Greaves

(57) ABSTRACT

An underfill composition is formulated to increase the surface tension thereof for use in capillary underfilling of an integrated circuit die that is coupled to a mounting substrate. A method includes mixing a surface tension-increasing additive with a bulk polymer and a hardener and allowing the underfill composition to flow between the integrated circuit die and the mounting substrate. An article is achieved by the method. The article can be assembled into a computing system.

10 Claims, 6 Drawing Sheets

U.S. PATENT DOCUMENTS

| | | |
|---|---|---|
| 2008/0009130 A1 | 1/2008 | Jayaraman |
| 2008/0017975 A1 | 1/2008 | Deppisch et al. |
| 2008/0039608 A1 | 2/2008 | Mills et al. |
| 2008/0110530 A1 | 5/2008 | Wilson et al. |
| 2008/0121845 A1 | 5/2008 | Mills et al. |
| 2009/0302280 A1 | 12/2009 | Simone et al. |

OTHER PUBLICATIONS

Grundke, K. et al., "Hyperbranched Polyesters as Potential Additives to Control the Surface Tension of Polymers", Surface Coatings International Part B: Coatings Transactions, vol. 88, Issue 2, Jun. 2005, pp. 101-106.

* cited by examiner

METHOD OF FABRICATING A CAPILLARY-FLOW UNDERFILL COMPOSITIONS

RELATED APPLICATIONS

This is a Divisional of patent application Ser. No. 11/613,805, filed on Dec. 20, 2006 entitled "CAPILLARY-FLOW UNDERFILL COMPOSITIONS, PACKAGES CONTAINING SAME, AND SYSTEMS CONTAINING SAME", which in incorporated by reference in its entirety.

TECHNICAL FIELD

Embodiments relate generally to integrated circuit devices. In particular, embodiments relate to underfill compositions for integrated circuit devices.

TECHNICAL BACKGROUND

Processors and other integrated circuit chips can generate significant heat. During miniaturization efforts, not only are circuits being crowded into smaller geometries, but also multiple chips are being crowded into smaller packages. Flip-chip configurations are affected by the miniaturization because mounting space is also shrinking Consequently, underfill compositions must fill smaller spaces.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Figure 1A:
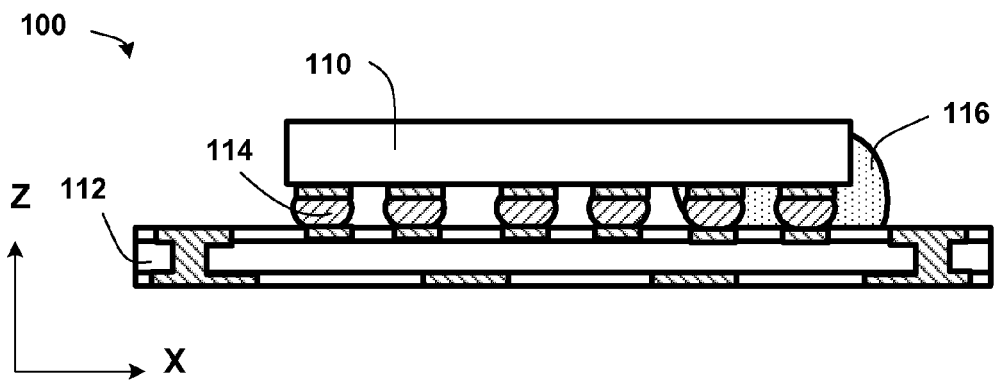
FIG. 1A is a cross-section elevation of a integrated circuit package during underfill processing according to an embodiment.

The present disclosure relates to underfill compositions that have increased surface tension for capillary-flow underfill processes.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die. A heat spreader in this disclosure is a thin structure that is dual-die-and-dual-heat spreader processed.

Capillary-flow underfill processing relies upon capillary pressure of the underfill material, to flow between a mounting substrate and an object such as an integrated circuit die. Capillary pressure can be described as $$\Pi = \frac{2\gamma\cos\theta}{h} \quad (1)$$

In equation (1), $\Pi$ represents the capillary pressure, $\gamma$ represents the surface tension of the underfill material, h is the gap between the mounting substrate and the integrated circuit die, and $\theta$ is the wetting angle of the underfill material upon the surfaces. Flow time between the mounting substrate and the integrated circuit die can be estimated by the expression $$T = \frac{3\mu L2}{h\gamma\cos\theta} \quad (2)$$

By finite-difference modeling the capillary flow of underfill material, we discovered that the time taken to underfill an integrated circuit die was reduced from 19 seconds to about 7 seconds.

In an embodiment, an underfill composition is formulated with a bulk polymer such as a bisphenol epoxy and an anhydride hardener. Other polymers can be used. The bulk polymer has a surface tension in a range from about 20 dynes cm$^{-1}$ to about 30 dynes cm$^{-1}$. In an embodiment, the bulk polymer has a surface tension in a range from about 35 dynes cm$^{-1}$ to about 50 dynes cm$^{-1}$. In an embodiment, a surface tension-increasing additive is mixed with the bulk polymer and hardener, and the surface tension of the underfill composition increases to greater than 30 dynes cm$^{-1}$. In an embodiment, the surface tension-increasing additive is mixed with the bulk polymer and hardener, and the surface tension of the underfill composition increases to a range from about 40 dynes cm$^{-1}$ to about 50 dynes cm$^{-1}$. This increased surface tension of the underfill composition can be achieved without significantly changing wetting and thermomechanical properties of the underfill composition. Consequently, the surface tension is increased over the range of 20-30 dynes cm$^{-1}$ by a factor from about 1.3 to about 2.5 according to various combinational embodiments.

In an embodiment, a surface tension-increasing additive is part of the total underfill composition in a weight range from about 0.1% to about 10%. One surface tension-increasing additive that can be used is a solvent such as glycerol. Glycerol ($C_3H_8O_3$, molecular formula ($CH_2OH$)$_3$), has a surface tension of about 63 dynes cm$^{-1}$. When added with a bulk polymer and a hardener, the glycerol increases the overall surface tension of the underfill composition. One surface tension-increasing additive that can be used is a solvent such as formamide. Formamide ($CH_2NO$), is also known as methanamide and is an amide that can be derived from formic acid.

Formamide has a surface tension of about 58 dynes cm$^{-1}$. When added with a bulk polymer and a hardener, the formamide increases the overall surface tension of the underfill composition.

In an embodiment, the underfill composition uses a surface tension-increasing additive that is a flexibilizer such as a di acrylate. In an embodiment, the di acrylate is polyethylene glycol (PEG) di acrylate. In an embodiment, the di acrylate is etholxylated bisphenol-A di acrylate. In an embodiment, the di acrylate is a combination of PEG di acrylate and etholxylated bisphenol-A di acrylate, and the PEG di acrylate is present in a greater amount than the etholxylated bisphenol-A di acrylate. In an embodiment, the di acrylate is a combination of the PEG di acrylate and the etholxylated bisphenol-A di acrylate, and the respective di acrylates are in a substantially equal proportion. In an embodiment, the di acrylate is a combination of PEG di acrylate and etholxylated bisphenol-A di acrylate, and the PEG di acrylate is present in a lesser amount than the etholxylated bisphenol-A di acrylate.

It now should become clear that the surface tension-increasing additive can include both a solvent that raises the surface tension, as well as a flexibilizer that raises the surface tension.

Various compositions are used as the bulk of the underfill material, including resins according to an embodiment. The underfill material includes resin, which may be present (including a hardener) in an amount of from about 25% to about 99.9% by weight based on the organic components present, and the balance is the surface tension-increasing additive.

In an embodiment, a cycloaliphatic epoxy resin composition is used. In an embodiment, a bisphenol A type epoxy resin composition is used. In an embodiment, a bisphenol-F type epoxy resin composition is used. In an embodiment, a novolac epoxy resin composition is used. In an embodiment, a biphenyl type epoxy resin composition is used. In an embodiment, a naphthalene type epoxy resin composition is used. In an embodiment, a dicyclopentadiene-phenol type epoxy resin composition is used. In an embodiment, a combination of any three of the compositions is used. In an embodiment, a combination of any four of the compositions is used. In an embodiment, a combination of any five of the compositions is used. In an embodiment, a combination of any six of the compositions is used. In an embodiment, a combination of all seven of the compositions is used.

In an embodiment, a cyanate ester composition or the like is used. In an embodiment, a polyimide composition or the like is used. In an embodiment, a polybenzoxazole composition or the like is used. In an embodiment, a polybenzimidazole composition or the like is used. In an embodiment, a polybenzothiazole composition or the like is used. In an embodiment, a combination of any two of the compositions is used. In an embodiment, a combination of any three of the compositions is used. In an embodiment, a combination of any four of the compositions is used. In an embodiment, a combination of all five of the compositions is used.

Other polymer compositions can be used as the underfill material alone but with a hardener and a surface tension-increasing additive, or the other polymer composition can be used in combination with the enumerated polymer compositions.

Additive Materials

In an embodiment, other additive materials are included in addition to the surface tension-increasing additive containing underfill compositions. The additive materials and the underfill compositions constitute "underfill mixtures" according to embodiments set forth herein.

Hardeners

As set forth herein, a hardener is added to assist in assuring sufficient stiffness to the underfill composition for a given application. In an embodiment, any of the diamines set forth in this disclosure can be combined with any of the hardeners set forth in this section.

In an embodiment, a liquid primary aromatic diamine is used as a hardener. One example liquid primary aromatic diamine hardener is diethyldiaminotoluene (DETDA), which is marketed as ETHACURE® 100 from Ethyl Corporation of Richmond, Va. Another example liquid primary aromatic diamine hardener is a dithiomethyldiaminotoluene such as Ethacure® 300. Another example liquid primary aromatic diamine hardener is an alkylated methylenedianiline such as Lapox® K-450 manufactured by Royce International of Jericho, N.Y.

In an embodiment, a liquid hindered primary aliphatic amine is used as a hardener. One example liquid hindered primary aliphatic amine is an isophorone diamine. Another example liquid hindered primary aliphatic amine is an alkylated methylenedianiline such as Ancamine® 2049 manufactured by Pacific Anchor Chemical Corporation of Allentown, Pa.

In an embodiment, a liquid secondary aromatic amine is used as a hardener. One example liquid secondary aromatic amine embodiment is an N,N'-dialkylphenylene diamine such as Unilink® O 4100 manufactured by DorfKetal of Stafford, Tex. Another example liquid secondary aromatic amine embodiment is an N,N'-dialkylmethylenedianilines: i.e. Unilink® 4200.

In an embodiment, a liquid secondary aliphatic amine is used as a hardener. One example liquid secondary aliphatic amine is an N,N'-dialkylmethylene-bis-(4-aminocyclohexane) such as Clearlink® 1000 manufactured by Dorf Ketal.

In an embodiment, a phenol is used as a hardener. One example phenol hardener is a bisphenol such as bisphenol A, bisphenol F, or bisphenol AP. Another example phenol hardener is a liquid novolac or cresol phenolic resin.

In an embodiment, an unsaturated compound is used as a hardener. One example unsaturated compound embodiment is a vinyl-substituted aromatic. Other example unsaturated compound embodiments are allyl-substituted aromatics and phenols such as Matrimid® B, manufactured by Huntsman Chemical of Salt Lake City, Utah, and TM124®, manufactured by Degussa of Parsippany, N.J. Other example unsaturated compound embodiments are 1-prop-2-enyl substituted aromatics and phenols such as TM123® manufactured by Degussa.

In an embodiment, an epoxy resin is used as a hardener. One example epoxy resin hardener embodiment includes glycidyl ethers of various bisphenols and chain extended versions thereof such as DER® 330, DER® 331, and DER® 354, manufactured by Dow Chemical of Midland, Mich. Examples of epoxy resin hardeners include modified bisphenol-based epoxy resins such as DER® 353, manufactured by Dow. Other example epoxy resin hardeners include biphenyl-based epoxies. Other example epoxy resin hardeners include naphthalene-based epoxies. Other example epoxy resin hardeners include novolac and cresol multifunctional resins such as DEN® 431, manufactured by Dow. Other example epoxy resin hardeners include cycloaliphatic epoxy resins. Other example epoxy resin hardeners include monofunctional, difunctional, and multifunctional epoxy compounds including those products employed as reactive diluents and modifiers. Specific examples thereof include aniline-based epoxies such as PEP® 6720, manufactured by Pacific Epoxy Polymers of Richmond, Va. Other example epoxy resins include modified epoxy resins such as carboxyl-terminated butadiene acrylonitrile adducts with epoxy compounds.

Any of the above hardeners may be employed alone or a mixture of several hardeners can be reacted with the surface tension-increasing additive in a bulk polymer and react to form cured crosslinked polymers at elevated temperature. The nature of such reactions is often complex and can include Michael addition to the maleimide bond, if present, anionic polymerization across multiple maleimide bonds, if present, Diels-Alder reactions, and ring-opening reactions. The cured underfill compositions thus obtained have properties amenable to electronics packaging including high glass transition temperature and low CTE.

Catalysts

In a embodiment, a catalyst is added to the surface tension-increasing additive in a bulk polymer in a ratio of catalyst-to-bulk polymer of about 0.01 parts per hundred underfill composition (any inorganic particulates not accounted) to about 10 parts per hundred parts underfill composition. In an embodiment, the cure property of the mixture with the catalyst includes reaching a gel time in less than about 20 seconds at the capillary-flow underfill temperature. After curing, the underfill composition has a hot hardness of greater than about 70 (ShoreD).

In an example embodiment, a triarylphosphine is mixed into the underfill composition in a range from about 0.01 to about 10 parts per hundred. The mixture is cured for about two minutes, and qualities are tested. In an example embodiment, a trialkylphosphine is mixed into the underfill composition in a range from about 0.01 to about 10 parts per hundred. The mixture is cured for about two minutes, and qualities are tested.

In an example embodiment, a tetraphenylphosphine salt is mixed into the underfill composition in a range from about 0.01 to about 10 parts per hundred. The mixture is cured for about two minutes, and qualities are tested.

In an example embodiment, a substituted imidazole is mixed into the underfill composition in a range from about 0.01 to about 10 parts per hundred. The mixture is cured for about two minutes, and qualities are tested. In an example embodiment, an unsubstituted imidazole is mixed into the underfill composition in a range from about 0.01 to about 10 parts per hundred. The mixture is cured for about two minutes, and qualities are tested.

In an example embodiment, an aryl-terteriary amine is mixed into the underfill composition in a range from about 0.01 to about 10 parts per hundred. The mixture is cured for about two minutes, and qualities are tested. In an example embodiment, an alkyl-terteriary amine is mixed into the underfill composition in a range from about 0.01 to about 10 parts per hundred. The mixture is cured for about two minutes, and qualities are tested.

In an example embodiment, a phenol is mixed into the underfill composition in a range from about 0.01 to about 10 parts per hundred. The mixture is cured for about two minutes, and qualities are tested. In an example embodiment, a phenoxide is mixed into the underfill composition in a range from about 0.01 to about 10 parts per hundred. The mixture is cured for about two minutes, and qualities are tested.

Fluxing Agents

In an embodiment, fluxing agents are added to assist in assuring quality electrical connections between the bumps and the bond pads during reflow. In an embodiment, a sulfonic acid-releasing fluxing agent is used. Sulfonic acids ($R\text{-}SO_3H$) are "isoesters" of carboxylic acids. Sulfonamides cannot only be activated thermally, but with the addition of a base such as tertiary amines, they release acidic hydrogen atoms, forming strong acids for reactions. Fluxes that can be activated at lower temperatures, such as from about 100° C. to about 300° C., are therefore useful.

One fluxing agent type includes organic carboxylic acids and the like. Another fluxing agent type includes polymeric fluxing agents and the like. The examples of fluxing agents are any chemicals containing a hydroxyl (—OH) group or a carboxylic (—COOH) group or both, such as glycerin, ethylene glycol, tartaric acid, adipic acid, citric acid, malic acid, meilic acid, and glutaric acid. The fluxing agent is usable during processing at the temperature ranges set forth in this disclosure for the catalyst and/or hardener embodiments, as well as temperatures ranging between about 100° C. to about 300° C. In an embodiment, the fluxing agent is provided in a range from about 1% to about 20% by weight of the total underfill composition when it is prepared.

Elastomers

In an embodiment, one additive material is an elastomer for imparting flexibility to the underfill composition. In an embodiment, the elastomer is provided in a range from about 0.5% about 5% by weight of the total underfill composition when it is prepared.

Reactive Diluents

Another additive material, according to an embodiment, is a reactive diluent. The specific reactive diluent that is employed will depend upon compatibility with the underfill composition. Because of the bonding and sealing nature of the process embodiments, the reactive diluent can react with and dissolve into the final underfill mixture before volatilizing, or it can both react and dissolve without being volatilized.

Reactive diluents for the above underfill compositions according to embodiments include low viscosity epoxy monomers such as Bi-phenyl epoxy, Bis-Phenol A epoxy, Bis-Phenol F epoxy, or the like. Other epoxies include phenyl glycidyl ethers, nonyl phenyl glycidyl ethers, p-butylphenyl glycidyl ethers, alkyl $C_8\text{-}C_{14}$ glycidyl ethers, cyclo aliphatic epoxies and the like. In an embodiment, the reactive diluent is provided in a range from about 1% to about 10% by weight of the total underfill composition when it is prepared. The reactive diluent can therefore cure or cross-link during curing.

Adhesion Promoters

Another additive material, according to an embodiment, is an adhesion promoter. The specific adhesion promoter that is employed depends upon compatibility with the given underfill composition. Adhesion promoters that can be added to the above underfill compositions include organic and inorganic combinations. In an embodiment, a silane coupling agent or the like is used as an adhesion promoter. In an embodiment, an organo-ziconate composition or the like is used as an adhesion promoter. In an embodiment, an organo-titanate composition or the like is used as an adhesion promoter. In an embodiment, the adhesion promoter is provided in a range from about 0.1% to about 5% by weight of the total underfill composition when it is prepared.

Flow Modifiers

Another additive material, according to an embodiment, is a flow modifier such as a surfactant. The specific flow modifier that is employed depends upon compatibility with the underfill composition. The surfactant requires properties such as compatibility with the underfill composition. In an embodiment, the surfactant is anionic such as long chain alkyl carboxylic acids, such as lauric acids, steric acids, and the like. In an embodiment, the surfactant is nonionic. Examples of nonionic surfactants are polyethylene oxides, poly propylene oxides, and the like. In an embodiment, the surfactant is cationic such as alkyl ammonium salts such as tert butyl ammonium chlorides, or hydroxides. In an embodiment, the flow modifier is provided in a range from about 0.1% to about 1% by weight of the total underfill composition when it is prepared.

Defoaming Agents

Another additive material, according to an embodiment, is a defoaming agent. The specific defoaming agent that is employed depends upon compatibility with the principal underfill composition. In an embodiment the defoaming agent is provided in a range from about 0.1% to about 2% by weight of the total underfill composition when it is prepared. Typical defoamers include silicones and acrylic polymers, i.e. Defoamer 45, Defoamer 455 (Dow), and various silicone oils.

Toughening Agents

Another additive material, according to an embodiment, is a toughening agent. A toughening agent causes the underfill composition to resist crack propagation. In an embodiment, an elastomer is used as the toughening agent. The specific elastomer that is employed to toughen the matrix depends upon compatibility with the underfill composition. For example, an elastomer that is used is carboxy-terminated polybutadiene-acrylonitrile (CTBN). CTBN is the generic name for a family of elastomer additives for epoxies, with the primary elastomer being functionalized butadine-acrylonitrile copolymer. These elastomers are available as epoxy, carboxy, amino and vinyl terminal functionalities. In an embodiment, rubber particles are used as toughening agents. The rubber particles can also be added as liquid and cured to become a toughening agent. Other elastomers may be used that are compatible with a given underfill composition. In an embodiment, the toughening agent is provided in a range from about 1% to about 10% by weight of the total underfill composition when it is prepared.

Fillers

Another additive material, according to an embodiment, is an inorganic particulate filler. Inorganic particulate fillers that optionally are added to the underfill mixtures include oxides of various elements such as silica, alumina, and others. Other inorganic particulate fillers include nitrides such as silicon nitride and the like. Other inorganic particulate fillers include conductive materials such as graphite, diamond, and the like. When an inorganic particulate filler is added, the underfill mixture is more appropriately referred to as an "underfill composite", in that it has inorganic particulate fillers as existing technology does, but it includes an underfill composition according to various embodiments. The underfill composite embodiments, unlike most other embodiments, include a multiple-phase substance. In an embodiment, the inorganic particulate filler is provided in a range from about 1% to about 70% by weight of the total underfill composite when it is prepared.

Radical Inhibitors

Another additive material includes at least one radical inhibitor. Radical inhibitors, such as butylatedhydroxystyrene (BHT), slow the polymerization of monomers if present, and can be used to achieve selected properties, among which are toughness, CTE, moisture content, and others. In an embodiment, the degree of polymerization is in a range from about 10% to about 100%. Approximate 100% polymerization leads to a rigid polymer. In an embodiment, the degree of polymerization is in a range from about 20% to about 95%. Approximate 95% polymerization leads to a semi-rigid polymer. In an embodiment, the degree of polymerization is in a range from about 30% to about 90%. Approximate 90% polymerization leads to a semi-flexible polymer. In an embodiment, the degree of polymerization is in a range from about 40% to about 85%. Approximate 85% polymerization leads to a flexible polymer. In an embodiment, the degree of polymerization is in a range from about 50% to about 80%. Approximate 80% polymerization leads to a semi-deformable polymer. In an embodiment, the degree of polymerization is in a range from about 60% to about 75%. Approximate 75% polymerization leads to a deformable polymer.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

FIG. 1A is a cross-section elevation of a integrated circuit package 100 during underfill processing according to an embodiment. An integrated circuit (IC) die 110 is flip-chip disposed above a mounting substrate 112 and is electrically coupled to the mounting substrate 112 through a series of electrical bumps, one of which is indicated with the reference numeral 114.

An underfill composition 116 is depicted as beginning to flow between the IC die 110 and the mounting substrate 112 by capillary action. The underfill composition 116 has a surface tension in a range greater than 30 dyne cm$^{-1}$. In an embodiment, the underfill composition has a surface tension during capillary-flow underfilling in a range from about 40 dyne cm$^{-1}$ to about 50 dyne cm$^{-1}$. In an embodiment, the underfill composition includes additives that make it an underfill mixture according to any of the embodiments and their equivalents set forth in this disclosure. In an embodiment, the underfill composition includes filler additives that make it an underfill composite according to any of the embodiments and their equivalents set forth in this disclosure.

Figure 1B:
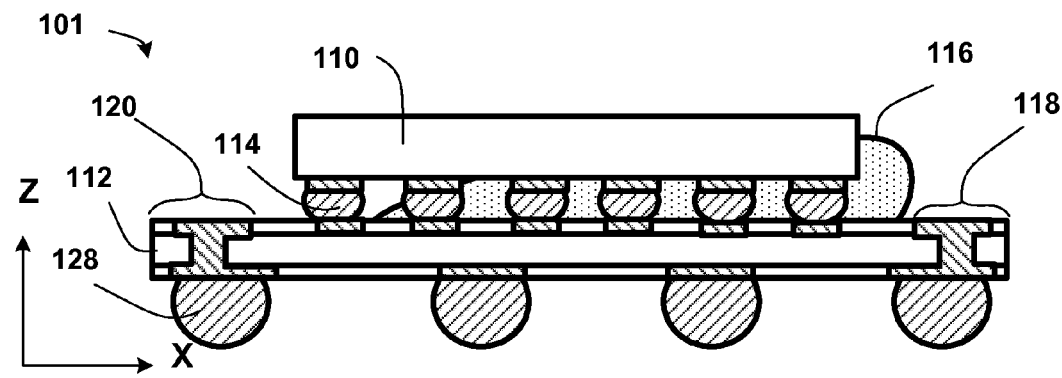
FIG. 1B is a cross-section elevation of the integrated circuit package depicted in FIG. 1A after further processing.

FIG. 1B is a cross-section elevation of the integrated circuit package depicted in FIG. 1A after further processing. Hereinafter, when an "underfill composition" is referred to, it can mean any underfill composition as understood in this disclosure, underfill mixture, or underfill composite.

The IC package 101 depicts further capillary flow of the underfill composition 116, such that it is drawing from right to left in the FIG., from a first keep-out zone (KOZ) 118 toward a second KOZ 120. The KOZs are regions that must remain clear of underfill materials for further packaging needs. The IC package also depicts a mounting substrate bump 128 that electrically couples the IC die 110 through the mounting substrate 112.

Figure 1C:
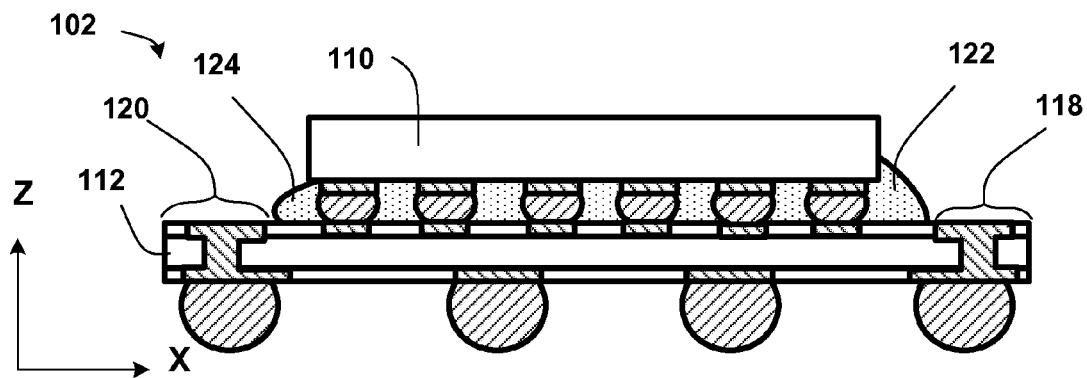
FIG. 1C is a cross-section elevation of the integrated circuit package depicted in FIG. 1B after further processing.

FIG. 1C is a cross-section elevation of the integrated circuit package depicted in FIG. 1B after further processing. The IC package 102 depicts still dynamic, but substantially completed capillary flow of the underfill composition 116. Final forming of the underfill composition 116, however, is such that it has not yet settled into a completed shape. The underfill composition 116 has a flow tongue 122 and a flow terminus 124, which is slightly smaller in lateral dimension (see FIG. 2) than the lateral dimension of the flow tongue.

Figure 1D:
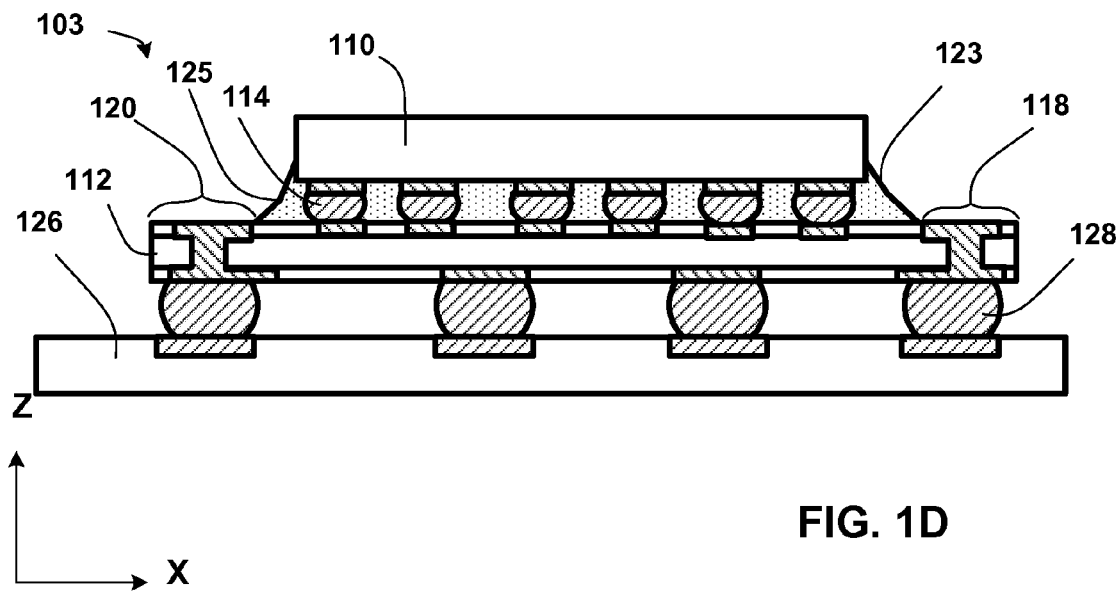
FIG. 1D is a cross-section elevation of the integrated circuit package depicted in FIG. 1C after further processing.

FIG. 1D is a cross-section elevation of the integrated circuit package depicted in FIG. 1C after further processing. The IC package 103 depicts a substantially hardened and cured underfill composition 117, such that it has settled into a completed shape. The underfill composition 117 has a final flow tongue 123 and a final flow terminus 125, which is slightly smaller in lateral dimension (see FIG. 2) than the lateral dimension of the flow tongue.

FIG. 1D also depicts further processing of the IC package 103 such that the mounting substrate 112 has been located on a board 126. The IC die 110 therefore makes electrical communication to the board 126 through the IC electrical bumps 114 and through at least one board electrical bump, one of which is depicted with reference numeral 128.

Figure 2:
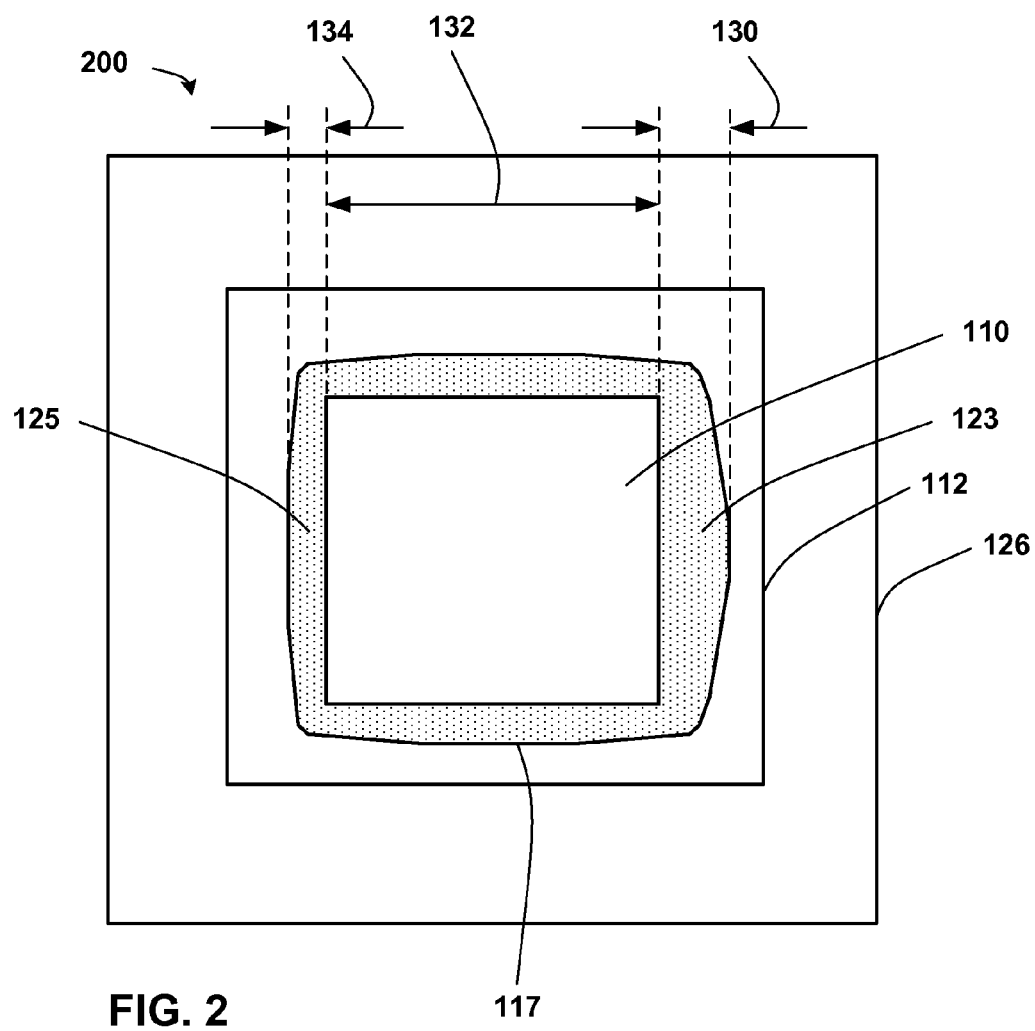
FIG. 2 is a top plan of an underfilled integrated circuit package according to an embodiment.

FIG. 2 is a top plan of an underfilled integrated circuit package 200 according to an embodiment. The plan view can be taken in an embodiment as the plan view of the IC package 103 depicted in FIG. 1D.

The IC die 110 is depicted disposed above the mounting substrate 112 and the board 126. The underfill composition is illustrated including the cured underfill composition 117, such that it has settled into a completed shape. The underfill composition 117 has the final flow tongue 123 and the final flow terminus 125. The final flow tongue 123 has a tongue dimension 130, the IC die 110 has a die dimension 132, and the final flow terminus 125 has a terminus dimension 134. The terminus dimension 134 is usually less than the tongue dimension 130. In an embodiment, the ratio of the tongue dimension 130 to the die dimension 132 is less than or equal to about 0.2. In an embodiment, the IC die 110 has a die dimension 132 of about 10 mm, and the tongue dimension 130 is about 2 mm.

Figure 3:
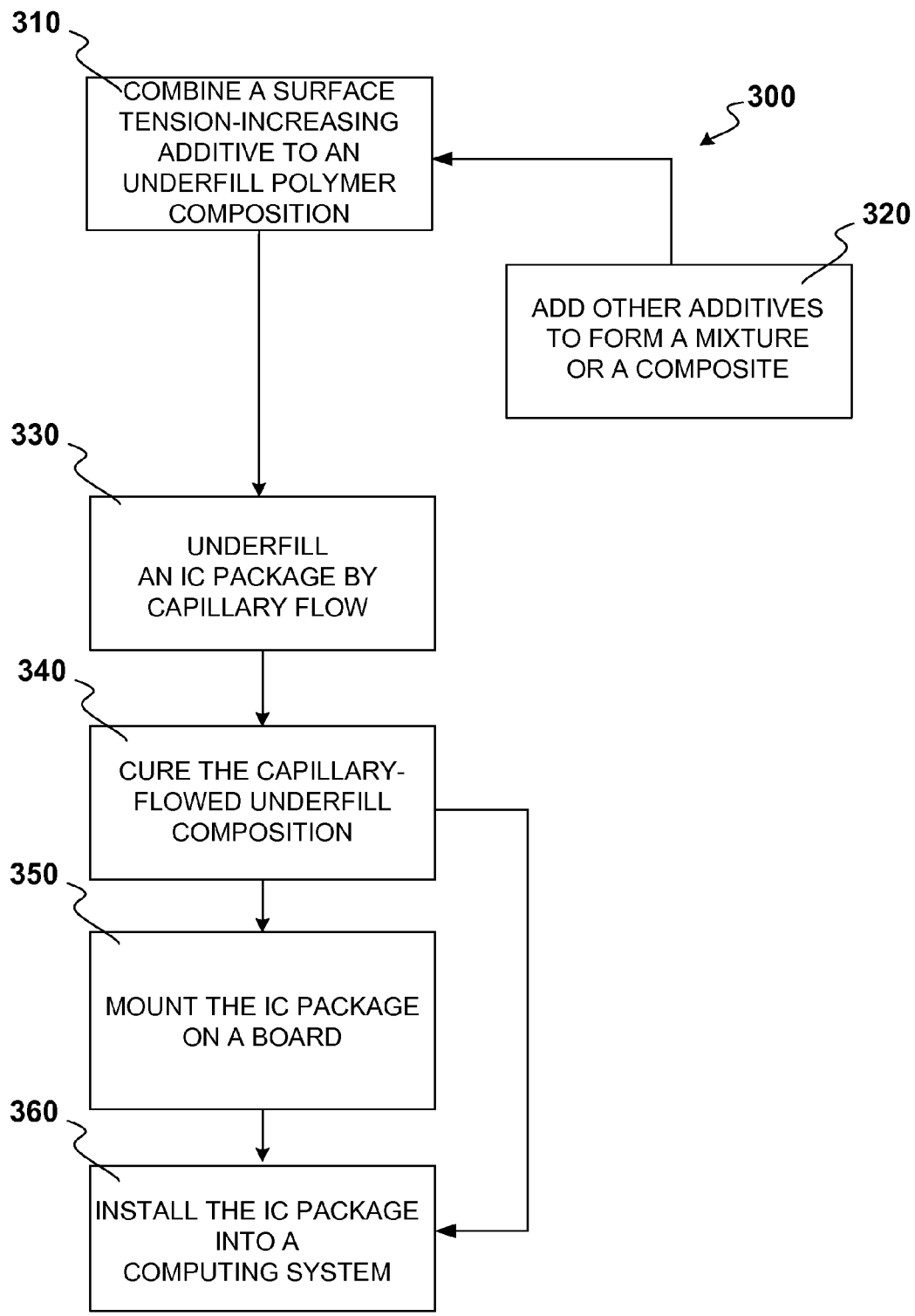
FIG. 3 is a flow chart that describes method flow embodiments.

FIG. 3 is a flow chart 300 that describes method flow embodiments.

At 310, the method includes adding a surface tension-increasing additive to an underfill polymer composition to increase the surface tension to a range between about 40 dyne $cm^{-1}$ to about 50 dyne $cm^{-1}$. In an embodiment, the method commences and terminates at 310.

At 320, the method includes adding other additives to the surface tension-increased underfill composition. The method at 320 can include one or both of forming an underfill mixture and an underfill composite. In an embodiment, the method commences at 310 and terminates at 320.

At 330, the method includes allowing the underfill composition (or mixture or composite) to underfill between an IC die and a mounting substrate by capillary flow. In a non-limiting example, a bisphenol epoxy polymer is present at 94%, an anhydride hardener is present at 1%, and a surface tension-increasing additive is present at 5%. In a non-limiting example, the underfill composition achieves a complete underfill process on a 10 mm-by-10 mm IC die and a 14 mm-by-14 mm mounting substrate, in a total time period of about 7 seconds. The spacing between the IC die and the mounting substrate is about 106 µm. In a non-limiting example, the underfill composition achieves a complete underfill process on a 10 mm-by-10 mm IC die and a 14 mm-by-14 mm mounting substrate, in a total time period of about 10 seconds. The spacing between the IC die and the mounting substrate is about 106 µm. In an embodiment, the method commences at 310 and terminates at 330.

At 340, the method includes curing the underfill composition. Curing is carried out at a temperature that achieves a rigid underfill composition that aids in protecting the active surface of the IC die, and that offers thermal stability to the IC die package. In an embodiment, the method commences at 310 and terminates at 340. Curing can include a thermal and chemical process that will leave the polymer(s), hardener(s), and at least one surface tension-increasing additive in a changed state that can be ascertained by observing the solution, mixture, and reaction products of the underfill composition.

At 350, the method includes mounting the underfilled IC package on a board.

At 360, the method includes installing the underfilled IC package into a computing system.

Figure 4:
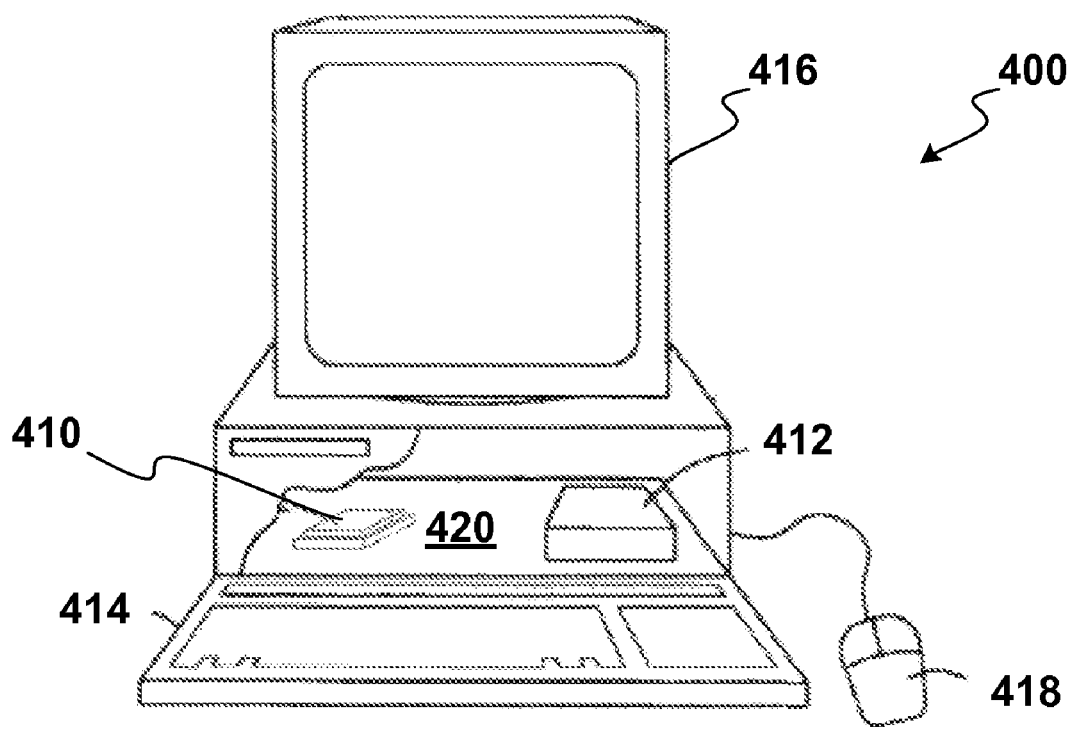
FIG. 4 is a cut-away elevation that depicts a computing system according to an embodiment.

FIG. 4 is a cut-away elevation that depicts a computing system 400 according to an embodiment. One or more of the foregoing embodiments of the surface tension-increasing additive containing underfill compositions manufactured according to a process embodiment may be utilized in a computing system, such as computing system 400 of FIG. 4. Hereinafter any surface tension-increasing additive containing underfill compositions manufactured according to a method embodiment alone or in combination with any other embodiment is referred to as an embodiment(s) configuration.

The computing system 400 includes at least one processor (not pictured), which is enclosed in an IC chip package 410 that contains a surface tension-increasing additive containing underfill composition. Also, a data storage system 412, at least one input device such as a keyboard 414, and at least one output device such as a monitor 416, are present for example. The computing system 400 includes a processor that processes data signals, and may include, for example, a microprocessor, available from Intel Corporation. In addition to the keyboard 414, the computing system 400 can include another user input device such as a mouse 418, for example. The computing system 400 can include a structure, after processing as depicted in FIGS. 1C, 1D, and 2 of a given surface tension-increasing additive containing underfill composition manufactured according to a method embodiment.

For purposes of this disclosure, a computing system 400 embodying components in accordance with the claimed subject matter may include any system that utilizes a microelectronic device system, which may include, for example, at least one of the surface tension-increasing additive containing underfill compositions manufactured according to a method embodiment that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage system 412.

In an embodiment, the computing system 400 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on a board 420. In this embodiment, an embodiment(s) configuration is coupled to the DSP, and a separate embodiment(s) configuration may be present that is coupled to the processor in the IC chip package 410. Additionally in an embodiment, an embodiment(s) configuration is coupled to a DSP that is mounted on the same board 420 as the IC chip package 410. It can now be appreciated that the embodiment(s) configuration can be combined as set forth with respect to the computing system 400, in combination with an embodiment(s) configuration as set forth by the various embodiments of the surface tension-increasing additive containing underfill compositions manufactured according to a method embodiment within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a handheld device such as a personal data assistant and the like. Another example is a die that can be packaged with an embodiment(s) configuration and placed in a vehicle such as an automobile, a locomotive, a watercraft, an aircraft, or a spacecraft.

Figure 5:
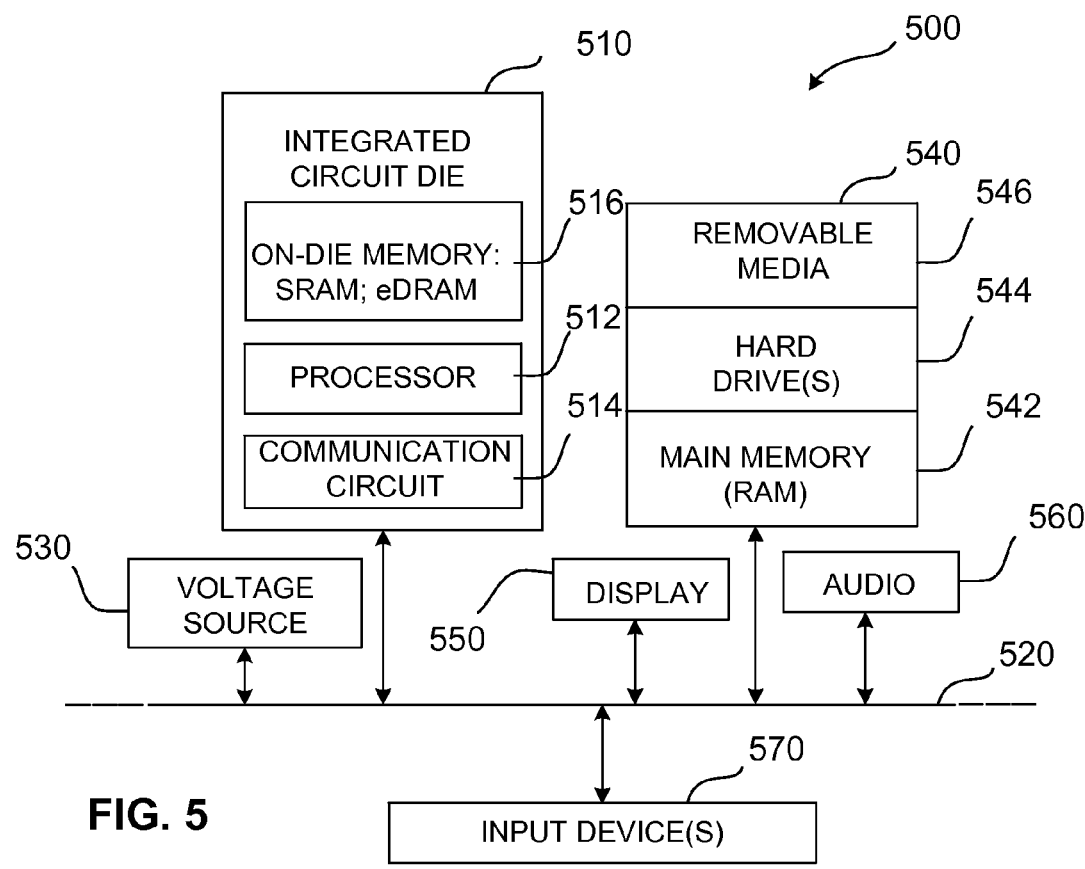
FIG. 5 is a schematic of a computing system according to an embodiment.

FIG. 5 is a schematic of an electronic system 500 according to an embodiment. The electronic system 500 as depicted can embody the computing system 400 depicted in FIG. 4, but the electronic system is depicted more schematically. The electronic system 500 incorporates at least one electronic assembly 510, such as an IC die as illustrated in FIGS. 1C, 1D, and 2. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the IC die 510. In some embodiments, the voltage source 530 supplies current to the integrated circuit 510 through the system bus 520.

The IC die 510 is electrically coupled to the system bus 520 and includes any circuit, or combination of circuits according to an embodiment. In an embodiment, the IC die 510 includes a processor 512 that can be of any type. As used herein, the processor 512 means any type of circuit such as, but not limited to, a microprocessor, a microcontroller, a graphics processor, a digital signal processor, or another processor. Accordingly, a surface tension-increasing additive containing an underfill composition can be part of the electronic system that seats at least one die, such as a processor or a die selected from a processor, or another die that is part of a chipset. Other types of circuits that can be included in the IC die 510 are a custom circuit or an ASIC, such as a communications circuit 514 for use in wireless devices such as cellular telephones, pagers, portable computers, two-way radios, and similar electronic systems. In an embodiment, the IC die 510 includes on-die memory 516 such as static random-access memory (SRAM). In an embodiment, the IC die 510 includes on-die memory 516 such as embedded dynamic random-access memory (eDRAM).

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital video disks (DVDs), flash memory keys, and other removable media known in the art.

In an embodiment, the electronic system 500 also includes a display device 550, and an audio output 560. In an embodiment, the electronic system 500 includes an input 570, such as a keyboard, mouse, trackball, game controller, microphone, voice-recognition device, or any other device that inputs information into the electronic system 500.

As shown herein, IC die 510 can be implemented in a number of different embodiments, including an electronic package, an electronic system, a computer system, one or more methods of fabricating an integrated circuit, and one or more methods of fabricating an electronic assembly that includes the surface tension-increasing additive containing underfill compositions as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72 (b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
mixing a bulk polymer underfill material and a hardener with a surface tension-increasing additive to form an underfill composition, wherein the bulk polymer underfill and hardener experience an increase in surface tension by a factor from about 1.3 to about 2.5 when combined with the surface tension-increasing additive.

2. The process of claim 1, further including flowing the underfill composition between an integrated circuit die and a mounting substrate.

3. The process of claim 1, further including flowing the underfill composition, by capillary action, between an integrated circuit die and a mounting substrate.

4. The process of claim 1, wherein the bulk polymer includes a bisphenol epoxy, the hardener includes an anhydride hardener, and the surface tension-increasing additive is selected from a di acrylate, glycerin, formamide, and combinations thereof, the process further including flowing the underfill composition between an integrated circuit die and a mounting substrate.

5. The process of claim 1, wherein the bulk polymer includes a bisphenol epoxy, the hardener includes an anhydride hardener, and the surface tension-increasing additive is selected from a polyethylene glycol di acrylate, ethoxylated bisphenol-A di acrylate, glycerin, formamide, and combinations thereof, the process further including flowing the underfill composition between an integrated circuit die and a mounting substrate.

6. The process of claim 1, wherein mixing includes combining the surface tension-increasing additive to form at least one of an underfill composition, an underfill mixture, and an underfill composite, and wherein the surface tension-increasing additive is present in a range from about 0.1 percent to about 10 percent.

7. A process comprising:
mixing a bulk polymer underfill material and a hardener with a surface tension-increasing additive to form an underfill composition, wherein the bulk polymer underfill and hardener experience an increase in surface tension by a factor from about 1.3 to about 2.5 when combined with the surface tension-increasing additive, wherein mixing includes combining the surface tension-increasing additive to form at least one of an underfill composition, an underfill mixture, and an underfill composite, and wherein the surface tension-increasing additive is present in a range from about 0.1 percent to about 10 percent; and flowing the underfill composition between an integrated circuit die and a mounting substrate.

8. The process of claim 7, wherein the bulk polymer includes a bisphenol epoxy, the hardener includes an anhydride hardener, and the surface tension-increasing additive is selected from a di acrylate, glycerin, formamide, and combinations thereof, and wherein flowing the underfill composition is by capillary action.

9. The process of claim 7, wherein the bulk polymer includes a bisphenol epoxy, the hardener includes an anhydride hardener, and the surface tension-increasing additive is selected from a polyethylene glycol di acrylate, ethoxylated bisphenol-A di acrylate, glycerin, formamide, and combinations thereof, and wherein flowing the underfill composition is by capillary action.

10. The process of claim 7, wherein flowing the underfill composition is by capillary action.

* * * * *